United States Patent [19]

Edwards

[11] Patent Number: 4,558,231
[45] Date of Patent: Dec. 10, 1985

[54] VARIABLE RATE BI-DIRECTIONAL SLEW CONTROL AND METHOD THEREFOR

[75] Inventor: David W. Edwards, Scottsdale, Ariz.

[73] Assignee: Motorola, Inc., Schaumburg, Ill.

[21] Appl. No.: 438,067

[22] Filed: Nov. 1, 1982

[51] Int. Cl.$^4$ .............................................. H03K 3/02
[52] U.S. Cl. ..................................... 307;271; 307/263; 328/60; 377/2; 377/45; 377/110
[58] Field of Search ....................... 307/263, 268, 271; 328/60; 377/45, 85, 2, 110, 111; 338/128, 131, 132, 134; 318/594, 597, 603, 663

[56] References Cited

U.S. PATENT DOCUMENTS

| | | | |
|---|---|---|---|
| 806,735 | 12/1905 | Carpenter | 200/11 G |
| 2,769,043 | 10/1956 | Ulinski | 200/18 |
| 2,806,928 | 9/1957 | Woods et al. | 338/120 X |
| 3,230,491 | 1/1966 | Dreyfus et al. | 338/134 X |
| 3,399,287 | 8/1968 | Euler | 200/159 |
| 3,418,547 | 12/1968 | Dudler | 318/663 X |
| 3,564,172 | 2/1971 | Laakso | 200/67 |
| 3,860,771 | 1/1975 | Lynn et al. | 200/76 X |
| 3,878,488 | 4/1975 | Blythe et al. | 307/271 X |
| 3,931,483 | 1/1976 | Thompson | 200/1 R |
| 3,940,674 | 2/1976 | Gill | 338/128 X |
| 3,986,154 | 10/1976 | Yamada et al. | 307/320 X |
| 4,007,357 | 2/1977 | Yanagishima | 377/45 |
| 4,035,758 | 7/1977 | Panke | 338/132 |
| 4,115,767 | 9/1978 | Brosh et al. | 307/271 X |
| 4,301,378 | 11/1981 | Cohlman et al. | 307/115 |
| 4,303,810 | 12/1981 | Oard | 200/5 R |

FOREIGN PATENT DOCUMENTS 0956070 1/1957 Fed. Rep. of Germany .
2723299 11/1978 Fed. Rep. of Germany ........ 377/45

OTHER PUBLICATIONS

Linear Integrated Circuits Data Book, Motorola, Inc., 1973, pp. 8-294-8-300.

*Primary Examiner*—Stanley D. Miller
*Assistant Examiner*—D. R. Hudspeth
*Attorney, Agent, or Firm*—Lowell W. Gresham

[57] ABSTRACT

A variable rate, bi-directional slew control employing a dual-concentric potentiometer having a first shaft attached to a first spring for urging it to remain in an extreme clockwise position and a second shaft urged by a second spring to remain in an extreme counterclockwise position wherein an extension of a sleeve provides the means for manual manipulation of the first shaft in a counterclockwise direction and the second shaft in a clockwise direction. A first tap associated with the first shaft is electrically connected to a first off-zero detector which is itself connected to a pulse generator which is in turn connected to an up input of an up/down counter. A second tap associated with the second shaft is electrically connected to a second off-zero detector which is connected with a second pulse generator which is in turn connected to a down input of the up/down counter.

13 Claims, 3 Drawing Figures

VARIABLE RATE BI-DIRECTIONAL SLEW CONTROL AND METHOD THEREFOR

BACKGROUND OF THE INVENTION

The present invention pertains in general to slew controls and more particularly to variable rate bi-directional slew controls for digital systems and methods therefor.

Slew controls are useful anywhere that the slewing of digital values to achieve a precise setting over wide ranges is desired. The setting of output values for frequency synthesizers, the setting of precise timing and/or the setting of precise delay in electronic test and measurement equipment, and the control of machine tool equipment are all examples of applications in which a variable rate bi-directional slew control is valuable.

One approach to providing a bi-directional slew control for a digital system involves the use of a keyboard interface in which one buttom is pushed to count up and another button is pushed to count down. However, it is difficult to control the slewing rate when using a push button and it is also difficult to stop instantly at a desired value when using a push button.

In another approach, an operator interface allowing more precise control of slewing rate is achieved by using a knob attached to a circular glass or plastic disk inscribed with marks at intervals about its circumference or to a metal disk with slotted holes at intervals about its circumference. Slew rate is determined by the number of scribed marks or holes that passes through a light beam in a given period of time. This sort of system is, however, costly and difficult to implement. In addition, slew rate is limited by the rate at which the knob can be turned by hand.

SUMMARY OF THE INVENTION

Accordingly it is an object of the present invention to provide a new and improved variable rate, bi-directional slew control.

It is a further object of the present invention to provide a variable rate, bi-directional control which is inexpensive and easy to implement.

Another object of the present invention is to provide a variable rate, bi-directional slew control having a higher slew speed with a wider rate control range than disk controls provide.

Yet another object of the present invention is to provide a new and improved method for controlling slew rate.

Among the advantages of the present invention is a mechanical arrangement allowing bi-directional (up/down) control on one shaft.

These and other objects and advantages of the present invention will become apparent to those skilled in the art upon consideration of the accompanying specification, claims and drawings.

In order to attain the above-mentioned and other objects and advantages the apparatus of the present invention involves a variable rate, bi-directional slew control. The apparatus of the present invention comprises a potentiometer having a tap which is capable of a change in position with respect to a reference point. A means for sensing position is coupled to the tap and a means for varying a slew rate from a basal level is coupled to the means for sensing position and to the potentiometer so that when the tap moves with respect to the reference point, the slew rate is changed corresponding to the change in position of the tap.

The method according to the present invention involves a method for controlling slew rate with a potentiometer having at least one tap. The method comprises the steps of varying the position of the potentiometer tap to provide a first signal level, sensing the position of the potentiometer tap to provide a second signal level indicative of the position of the tap, and generating pulses in response to said second signal level at a rate corresponding to the first signal level.

DESCRIPTION OF THE PREFERRED EMBODIMENT

Figure 1:
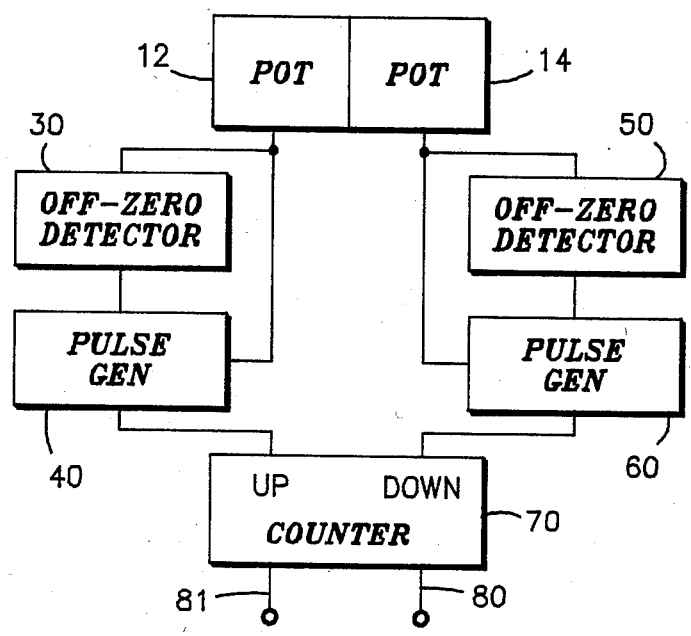
FIG. 1 is a block diagram of a device embodying the present invention.

In a preferred embodiment of a bi-directional slew control according to the present invention as illustrated in FIG. 1, a first potentiometer 12 is connected to a first off-zero detector 30 which is in turn connected to a first pulse generator 40. Pulse generator 40 is also connected to an up input of an up/down pulse counter 70 and to potentiometer 12. Counter 70 is in turn connected to a first output terminal 80 and to second output terminal 81.

A second potentiometer 14 is connected to a second off-zero detector 50 which is in turn connected to a second pulse generator 60. Pulse generator 60 is connected to a down input of counter 70 and to potentiometer 14.

Potentiometers 12 and 14 may be two separate units within a dual-concentric potentiometer, as described below, but because potentiometers of varying kinds actuatable according to the present invention are readily available to one skilled in the art, it is not intended that the present invention be limited to a dual-concentric potentiometer. Off-zero detectors 30 and 50 and pulse generators 40 and 60 are also exemplified below but because one skilled in the art is aware of a wide variety of suitable detectors and pulse generators, it is not intended that the present invention be limited to the examples below. Up/down counters are readily available to those skilled in the art and need not be discussed further.

In the operation of the apparatus of FIG. 1, a variation in the setting of potentiometer 12 is sensed as a change in a voltage drop across potentiometer 12 by off-zero detector 30 which provides an increased output signal level corresponding to the voltage drop. Pulse generator 40 responds to an increase in signal level from off-zero detector 30 by generating a number of output pulses.

The rate at which output pulses are generated by pulse generator 40 is governed by the settling of potentiometer 12. Therefore as the set of potentiometer 12 is advanced from a first extreme position, the rate of pulses produced by pulse generator 40 is increased. As the setting of potentiometer 12 is further advanced to a second extreme position, the rate of pulse by pulse generator 40 is at a maximum. When the setting of potentiometer 12 is returned to the first extreme position, off-zero detector 30 senses a zero position and ceases to have a high output. A low output from off-zero detector 30 inhibits further pulse generation by pulse generator 40.

Output pulses from pulse generator 40 are applied to the up input of counter 70. Therefore, the total number of counts stored in counter 70 is the cumulative total of the pulses received from pulse generator 40.

Likewise, a variation in the setting of potentiometer 14 from a first extreme position causes off-zero detector 50 to allow pulse generator 60 to generate pulses. The rate of pulse generation by pulse generator 60 is increased as the setting of potentiometer 14 is further increased. Pulses generated by pulse generator 60 cease when the setting of potentiometer 14 is returned to the first extreme position because off-zero detector 50 senses a zero position and inhibits pulse generator 60.

Output pulses generated by pulse generator 60 are applied to the down input of counter 70. The total number of pulses applied by pulse generator 60 are deducted from the total count previously stored in counter 70. Thus, the cumulative count in counter 70 is equal to the total number of pulses produced by pulse generator 40 minus the total number of pulses produced by pulse generator 60.

A signal indicative of a count from counter 70 is applied to output terminals 80 and 81. As is obvious to one skilled in the art, the rate of change of the count applied to terminals 80 and 81 increases or decreases as the absolute magnitude of the potential drop across potentiometers 14 and 12 respectively.

Figure 2:
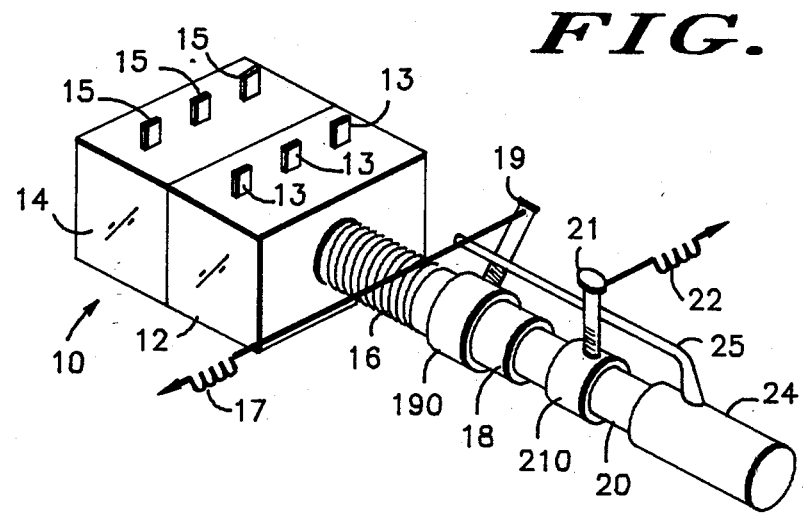
FIG. 2 is a perspective view of a modified dual-concentric potentiometer according to the present invention.

In FIG. 2, in which structures also shown in FIG. 1 are referenced by the same numerals, an actuator and potentiometer combination for a variable rate, bi-directional slew control is shown according to the present invention. A dual-concentric potentiometer 10 comprises first potentiometer 12 having a shaft 18 and leads 13. Second potentiometer 14 has a second shaft 20 which is coaxially disposed within and movable independent from shaft 18. Potentiometer 14 also has leads 15 which are suitable for providing electrical connections for potentiometer 14 just as leads 13 are suitable for providing electrical connections for potentiometer 12. A threaded mounting bushing 16 is fixed to potentiometer 12 as a permanent part of potentiometer 10 and is coaxially disposed around shaft 18, which can rotate freely within bushing 16.

Additions made to dual-potentiometer 10 in order to provide an actuator for a bi-directional control according to the present invention comprise a first set screw 21 which has a first end passing through and threadedly affixed to a first bushing 210 disposed around shaft 20 so that the first end presses against shaft 20. A second end of set screw 21 connected to a first end of a first resilient element 22. A second end of resilient element 22 is fixed in position. A second bushing 190 is disposed around shaft 18 and is threadedly affixed to a first end of a second set screw 19 which passes through bushing 190 to press against shaft 18. A second end of set screw 19 is connected to a first end of a second resilient element 17. A second end of resilient element 17 is fixed. Bushing 210 is tightened to shaft 20 and bushing 190 is tightened to shaft 18 by turning set screws 21 and 19 respectively.

A control sleeve 24 is coaxially disposed around and freely rotatable about an end portion shaft 20 which extends within sleeve 24. An extension 25 has a proximal end connected to sleeve 24, a medial portion which passes between set screw 21 and the fixed end of resilient element 22 and the distal portion which passes between set screw 19 and the fixed end of resilient member 17. The fixed ends of resilient members 17 and 22 are located on opposite sides of extension 25.

Resilient members, such as springs, are commonly available to those skilled in the art and need not be elaborated upon. Likewise, set screws, dual concentric potentiometers and sleeves having extensions are readily obtained or constructed by those skilled in the art without the use of inventive skill.

In the operation of the control according to the present invention as depicted in FIG. 2, turning sleeve 24 in a clockwise direction causes the distal end of extension 25 to press against set screw 19, thus extending resilient element 17 and turning shaft 18 in a clockwise direction. Similarly, turning sleeve 24 in a counterclockwise direction presses the medial portion of extension 25 against set screw 21 causing the extension of resilient element 22 and causing shaft 20 to rotate in a counterclockwise direction. Shaft 18 is held in an extreme clockwise position by resilient element 17 and shaft 20 is held in an extreme counterclockwise position by resilient element 22, unless either is acted upon by extension 25, so that in the absence of manipulation an equilibrium condition obtains. When the equilibrium condition is disrupted by rotating sleeve 24 in a clockwise direction, shaft 18 is urged in a counterclockwise direction by resilient element 17 acting through set screw 19 just as resilient element 22 urges shaft 20 in a clockwise direction whenever shaft 20 is acted on in a counterclockwise direction due to a counterclockwise rotation of sleeve 24. Because shafts 18 and 20 are respectively connected to potentiometers 12 and 14 respectively, the potentiometers are maintained in a extreme position unless the shafts are acted upon by sleeve 24. Choosing the extreme positions of potentiometers 12 and 14 in the equilibrium condition of the control to be at low potential by proper positioning of bushings 190 and 210, a bi-directional control is provided for increasing an output in one of two directions as selected by the rotational direction of sleeve 24.

Figure 3:
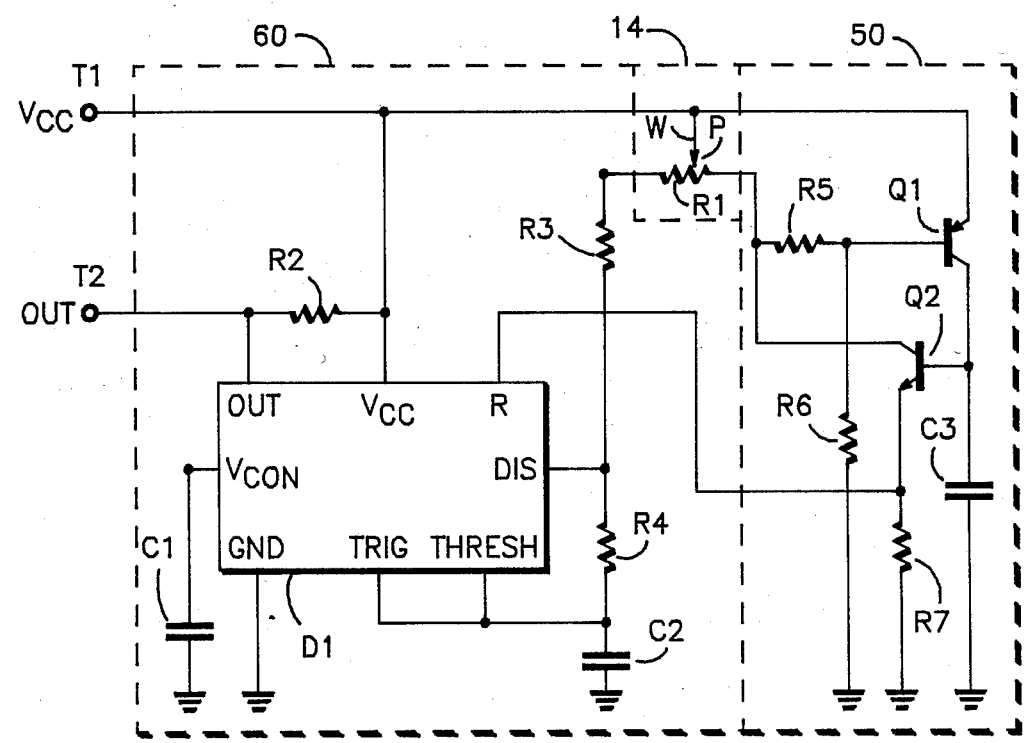
FIG. 3 is a schematic diagram of an off-zero detector and a pulse generator according to the present invention.

FIG. 3 is a schematic diagram of portions 14, 50 and 60 of a bi-directional slew control which provide pulses for the up input of counter 70. Portions 12, 30 and 40 of the slew control according to the present invention are schematically identical to portions 14, 50 and 60 respectively. For this reason, only the latter are illustrated.

In FIG. 3, a terminal T1 suitable for application of a positive potential $V_{CC}$ is connected to a first end of a resistor R2 and to a $V_{CC}$ input of a timing circuit D1 in pulse generator 60. Terminal T1 is also connected to a tap or wiper W in potentiometer 14 and to an emitter of a PNP transistor Q1 in off-zero detector 50. An output terminal T2 is connected to a second end of resistor R2 and to an OUT pin of timing circuit D1.

Within potentiometer 14, wiper W makes contact with a resistive element R1 at a variable tap point P. Wiper W is, of course, coupled to shaft 20 so that wiper W is moved and hence tap point P is varied by turning shaft 20. A first end of resistor R1 is connected to a first end of a resistor R3 which is in pulse generator 60. A second end of resistor R1 is connected to a first end of a resistor R5 in off-zero detector 50.

Within off-zero detector 50, a collector of transistor Q1 is connected to a first end of a capacitor C3 while a second end of capacitor C3 is connected to ground. A base of transistor Q1 is connected to a second end of resistor R5 and to a first end of a resistor R6, a second end of which is connected to ground. The collector of transistor Q1 is also connected to a base of a NPN transistor Q2, a collector of which is connected to the first end of resistor R5. An emitter of transistor Q2 is connected to a reset pin R of timing circuit D1 in pulse generator 60 and to a first end of a resistor R7, a second end of which is connected to ground.

Within pulse generator 60, a discharge pin, DIS, of circuit D1 is connected to a second end of resistor R3 and to a first end of a resistor R4. A second end of resistor R4 is coupled to a first end of a capacitor C2, to a threshold pin THRESH of circuit D1 and to a trigger pin TRIG of circuit D1. A control voltage pin $V_{CON}$ of circuit D1 is connected to a first end of a capacitor C1. A second end of capacitor C1, a ground pin GND of circuit D1 and a second end of capacitor C2 are all connected to ground.

Timing circuit D1 may be any of the time delays having the generic type number 555. For example, time delays having a manufacture number NE555V may be used and are available from Advanced Micro Devices Inc., Sunnyvale, California, Fairchild Camera and Instrument Corporation, Semiconductor Products Group, Mountain View, California and Intersil, Inc., Cupertino, California, among others. A monolithic timing circuit having a manufacture number MC1455 is available from Motorola, Inc., Semiconductor Products Sector, Phoenix, Arizona, and may also be used when wired in an astable mode as shown in the "Linear Integrated Circuits Data Book," Third Edition, published by Motorola, Inc., at pages 8-294 through 8-300, which pages are incorporated by reference herein.

Potentiometers, resistors, capacitors and both NPN and PNP transistors having control electrodes, such as base electrodes, and other electrodes are well known and readily available to those skilled in the art and will not be discussed further except to note that the circuit of FIG. 3 may comprise components as shown in Table I.

TABLE I

| Q1 | 2N2222A |
|----|---------|
| Q2 | 2N2907A |
| R1 | 2.5 MΩ |
| R2 | 4.7 kΩ |
| R3 | 220 Ω |
| R4 | 68 Ω |
| R5 | 12 kΩ |
| R6 | 1 MΩ |
| R7 | 10 kΩ |
| C1 | 0.01 μF. |
| C2 | 0.01 μF. |
| C3 | 0.01 μF. |

In the operation of the circuit of FIG. 3, when the shaft of potentiometer 14 is at its extreme clockwise or zero position, voltage $V_{CC}$ is applied to the base of transistor Q1 across a voltage divider formed by resistors R5 and R6 and to the emitter of transistor Q1. In this situation, the base of Q1 is less than 0.5 volts below the emitter of Q1 so that Q1 is turned off. Furthermore, because transistor Q1 is turned off, the base of transistor Q2 is at a relatively low potential so that transistor Q2 is turned off. Because transistor Q2 is turned off, the reset pin R of circuit D1 is maintained at the relatively low potential above ground determined by resistor R7 so that pin R is below the approximately +0.7 volts dc required for circuit D1 to provide a pulsing output.

As shaft 20 is turned counter clockwise so that wiper W moves tap point P to the left in FIG. 3, the voltage applied to the base of Q1 is reduced by an amount proportional to the portion of resistive element R1 interposed between point P and the first end of R5. When the base of Q1 drops about 0.5 volts below the emitter of Q1, transistor Q1 is turned on according to the relationship, $$V_{BEQ1} = V_{CC} - V_{CC}\frac{R6}{R6 + R5 + \Delta R1} \quad (1)$$

where:

$V_{BEQ1}$ = the base-emitter voltage drop of transistor Q1;

$\Delta R1$ = the resistance between W and the second end of R1,

R5 = the resistance associated with element R5,

R6 = the resistance associated with element R6, and where $V_{CC}$ is as defined above.

The resulting collector current from transistor Q1 increases the base voltage level of transistor Q2 and turns on transistor Q2 and is slowed and smoothed by capacitor C3. When transistor Q2 is on, its collector current flows through the increased resistance between W and the first end of R1 and thereby decreases the base drive voltage to transistor Q1 to provide a degree of hysteresis.

In the operation of pulse generator 60, reset pin R must be above approximately +0.7 volts dc in order for circuit D1 to provide a pulsed output. As this voltage is exceeded when transistor Q2 is turned on, circuit D1 provides a pulsed output.

Capacitor C2 charges through the combined resistances of R4, R3 and that portion of resistive element R1 which is between the first end of resistor R3 and tap point P. When capacitor C2 has charged to two-thirds $V_{CC}$, application of this voltage level to pin THRESH of circuit D1 causes circuit D1 to set pin OUT at a low level and to discharge capacitor C2 through resistor R4 by way of pin DIS. When the voltage across capacitor C2 falls below one-third $V_{CC}$, the low level of voltage on pin TRIG triggers circuit D1 to set output pin OUT at a high level and to cease discharging capacitor C2 by way of pin DIS. Thus, circuit D1 is connected so that it will retrigger itself and cause voltage across capacitor C2 to oscillate between one-third $V_{CC}$ and two-thirds $V_{CC}$.

The duty cycle of circuit D1, DC, is given by:

$$DC = \frac{R4}{2R4 + R3 + RP} \quad (2)$$

where:

RP = the resistance of the portion of resistive element R1 between tap point P and the first end of resistor R1

R3 = the resistance associated with element R3, and

R4 = the resistance associated with element R4.

Thus, by varying the ratio of resistor R4 to the denominator of equation (2), as is done by varying the position of tap point P, the duty cycle of circuit D1 and hence the frequency of the pulsed output of circuit D1 is varied.

The pulsed output signal from pin OUT is passed through terminal T2 to the down input of down counter 70. When a circuit similar to that in FIG. 3 but containing potentiometer 12 is connected to the up input of counter 70, a clockwise rotation of sleeve 24 generates up-pulse commands and a counter clockwise rotation of sleeve 24 generates down-pulse commands to counter 70. The cumulative number of pulses stored in counter 70 may be used on a control register of a frequency synthesizer or other control device. Feedback of the counter content may be displayed in a digital readout. Thus, an operator merely rotates sleeve 24 clockwise or counter clockwise until the proper number corresponding to a proper value, for example a frequency in a frequency synthesizer, is obtained. If the proper number is over-shot, the bidirectional variable rate nature of the control allows the number to be incremented or decremented at a slow rate.

The ratio of the highest to lowest attainable rates is dependent upon the potentiometer used, but ratios on the order of 1000:1 are attainable. Thus, an operator may slew to a gross value at a high rate and may trim to the desired value at progressively slower rates, resulting in a much more efficient human interface than is possible with multiple controls of varying rates or coarse-medium-fine adjustment schemes.

While the present invention has been described in terms of a preferred embodiment, further modifications and improvements will occur to those skilled in the art. I desire it to be understood, therefore, that this invention is not limited to the particular form shown and that I intend in the appended claims to cover all such equivalent variations which come within the scope of the invention as described.

I claim:

1. A variable rate slew control comprising:
a potentiometer having at least one tap capable of a change in position with respect to a reference point;
means for sensing position of said tap relative to said reference point, said sensing means being coupled to said potentiometer and including:
a terminal suitable for application of a source of potential,
a first semiconductor device having at least one control electrode coupled to said potentiometer, a first electrode coupled to said terminal and a second electrode; and
a second semiconductor device having at least one control electrode coupled to said second electrode of said first semiconductor device, a first electrode coupled to said potentiometer, and a second electrode coupled to said means for varying a slew rate; and
means for bi-directionally varying a slew rate of a digital signal, said varying means being coupled to said potentiometer and coupled to said means for sensing position so that when said tap changes position with respect to said reference point, the slew rate of the digital signal is changed corresponding to said change in position of said tap.

2. The control as recited in claim 1 wherein said first electrode of said second semiconductor device is coupled to said control electrode of said first semiconductor device to provide hysteresis.

3. The control as recited in claim 1 wherein said control electrode of said second semiconductor device is coupled to a capacitor.

4. A variable rate, bi-directional control comprising:
a dual concentric potentiometer exhibiting a first resistance between a first terminal and a first tap, said first resistance being for providing a first signal, the first tap having a first extreme clockwise position, a first extreme counterclockwise position, and an equilibrium position between the first extreme positions, and said potentiometer exhibiting a second resistance between a second terminal and a second tap, said second resistance being for providing a second signal, and the second tap having a second extreme clockwise position, and having a second extreme counterclockwise position so that the equilibrium position is between the second extreme positions;
first means, coupled to the first tap, for forcing the first tap toward the first extreme clockwise position;
second means, coupled to the second tap, for forcing the second tap toward the second extreme counterclockwise position, said second means for forcing being coupled to the second tap so that the second tap is urged by said second means for forcing toward the equilibrium position when the second tap is between the equilibrium position and the second extreme clockwise position, and said first means for forcing being coupled to the first tap so that the first tap is urged by said first means for forcing toward the equilbrium position when the first tap is between the equilibrium position and the first extreme counterclockwise position; and
means for providing a digital output signal which bi-directionally slews at a variable rate, said providing means comprising:
a first off-zero detector coupled to the first tap so that a third signal is generated in response to a displacement of the first tap from the equilibrium position toward the first extreme counterclockwise position;
a second off-zero detector coupled to the second tap so that a fourth signal is generated in response to a displacement of the second tap from the equilibrium position toward the second extreme clockwise position;
a first pulse generator having inputs responsive to said first and third signals and having an output;
a second pulse generator having inputs responsive to said second and fourth signals and having an output; and
an up/down counter having a first input coupled to said first pulse generator output, a second input coupled to said second pulse generator output, and an output for providing the digital output signal.

5. The control as recited in claim 4 wherein said first pulse generator comprises an astable multivibrator.

6. The control as recited in claim 4 wherein said first off-zero detector comprises:
a terminal suitable for application of a source of potential;
a first semiconductor device having at least one control electrode coupled to said first variable resistance, a first electrode coupled to said terminal and a second electrode; and
a second semiconductor device having at least one control electrode coupled to said second electrode of said first semiconductor device, a first electrode coupled to said first variable resistance, and a second electrode coupled to said first pulse generator.

7. The control as recited in claim 6 wherein said first electrode of said second semiconductor device is coupled to said control electrode of said first semiconductor device to provide hysteresis.

8. The control as recited in claim 6 wherein said control electrode of said second semiconductor device is coupled to a capacitance.

9. The control as recited in claim 4 wherein said second pulse generator comprises an astable multivibrator.

10. The control as recited in claim 4 wherein said second off-zero detector comprises:
   a terminal suitable for application of a source of potential;
   a first semiconductor device having at least one control electrode coupled to said second variable resistance, a first electrode coupled to said terminal, and a second electrode; and
   a second semiconductor device having at least one control electrode coupled to said second electrode of said first semiconductor device, a first electrode coupled to said second variable resistance, and a second electrode coupled to said second pulse generator.

11. The control as recited in claim 10 wherein said first electrode said second semiconductor device is coupled to said control electrode of said first semiconductor device to provide hysteresis.

12. The control as recited in claim 10 wherein said control electrode of said second semiconductor device is coupled to a capacitance.

13. The control as recited in claim 4 wherein said first means for forcing comprises means for resiliently coupling the first tap to a first fixed position and wherein said second means for forcing comprises means for resiliently coupling the second tap to a second fixed position.

* * * * *